United States Patent [19]
Rezeanu

[11] Patent Number: 6,157,582
[45] Date of Patent: Dec. 5, 2000

[54] DYNAMIC PULL-UP SUPPRESSOR FOR COLUMN REDUNDANCY WRITE SCHEMES WITH REDUNDANT DATA LINES

[75] Inventor: Stefan-Cristian Rezeanu, Colorado Springs, Colo.

[73] Assignee: Cypress Semiconductor Corporation, San Jose, Calif.

[21] Appl. No.: 08/971,627

[22] Filed: Nov. 17, 1997

[51] Int. Cl.[7] .................................. G11C 7/00; G11C 8/00
[52] U.S. Cl. ................ 365/200; 365/189.11; 365/230.06
[58] Field of Search ............................... 365/200, 189.11, 365/230.06

[56] References Cited

U.S. PATENT DOCUMENTS

| | | | |
|---|---|---|---|
| 4,714,839 | 12/1987 | Chung | 365/200 |
| 5,134,583 | 7/1992 | Matsuo et al. | 365/200 |
| 5,295,114 | 3/1994 | Kobayashi | 365/200 |
| 5,359,560 | 10/1994 | Suh et al. | 365/200 |
| 5,359,561 | 10/1994 | Sakomura et al. | 365/200 |
| 5,519,657 | 5/1996 | Arimoto | 365/200 |
| 5,555,212 | 9/1996 | Toshiaki et al. | 365/200 |
| 5,568,433 | 10/1996 | Kumar | 365/200 |
| 5,574,688 | 11/1996 | McClure et al. | 365/200 |
| 5,673,227 | 9/1997 | Engles et al. | 365/200 |

*Primary Examiner*—Trong Phan
*Attorney, Agent, or Firm*—Wagner, Murabito & Hao LLP

[57] ABSTRACT

A reduced complexity, dynamic pull-up suppressor for column redundancy write schemes with redundant data write lines is provided. Logic values of input data signals during the width of an internal write pulse are used to reduce the redundant data line crowbar while at the same time increasing the speed of the write to a redundant column. The full recovery capability of dynamic pull-up circuits, which are all enabled to speed up the recovery of the redundant data write lines at the end of the write operation, is available. The data write bus is separated from the redundant write lines, thus ensuring a consistent loading of the data write bus independent of whether redundancy is used or not. According to one embodiment, a circuit including dynamic pull-up elements configured to drive a redundant data line of a memory device to a logic state according to a state of an input data signal is provided. The circuit may further include a static pull-up circuit configured to hold the redundant data line at a logic high potential when column redundancy is not used and solid data is written.

17 Claims, 10 Drawing Sheets

DYNAMIC PULL-UP SUPPRESSOR FOR COLUMN REDUNDANCY WRITE SCHEMES WITH REDUNDANT DATA LINES

FIELD OF THE INVENTION

The present invention relates to memory devices and, in particular, those memory devices which employ redundant storage elements and which implement schemes for writing data to the redundant storage elements.

BACKGROUND

Conventional read/write memories, for example static random access memories (SRAMs), as are commonly used in computer systems often include redundant storage elements. These elements (arranged as redundant rows and/or columns which may be located adjacent to a regular memory core) may be utilized in the event some of the regular storage elements of a memory core are found to be defective. Thus, during write operations (e.g., where data is written to the memory device) there is a need to provide a redundant column with appropriate data signals.

Figure 1:
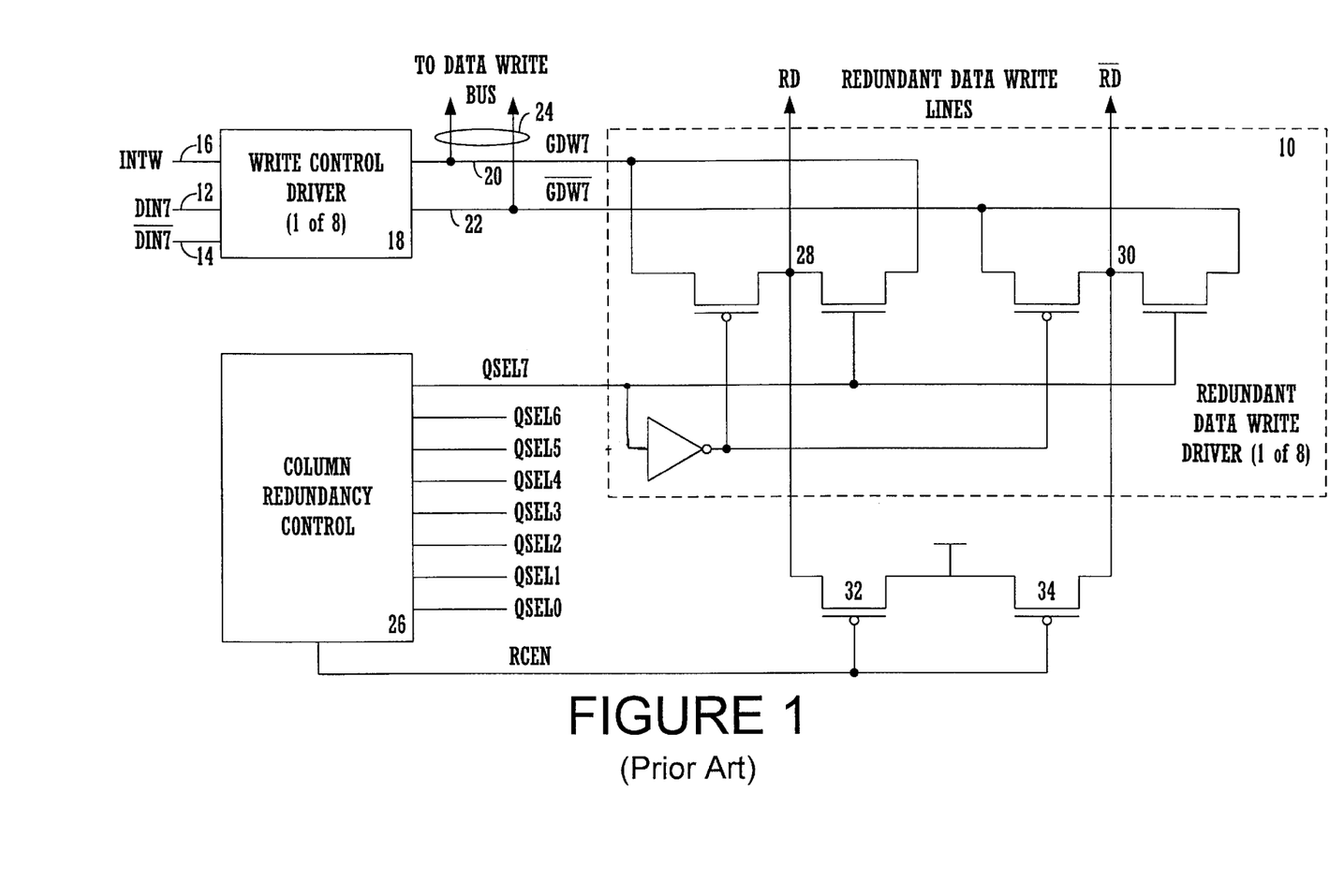
FIG. 1 illustrates a conventional scheme for driving redundant data write lines of a memory device using transmission gates.

In the past, two schemes (or variations thereof) have generally been available to write data to redundant columns of a memory device. A popular choice was to use transmissions gates to pass data from a selected pair of global data lines to a pair of redundant data lines. An implementation of such a scheme is shown in FIG. 1, where the redundant data write driver 10 shown in the dotted outline is repeated identically for each pair of internal data lines. Thus, for an embodiment with eight pairs of data lines, seven more identical redundant data write drivers, e.g., for a total of eight, are provided. The seven identical redundant data write drivers not shown in the figure are driven by the remaining seven pairs of global data lines (GDWx and $\overline{\text{GDWx}}$, x=0–6) and seven select lines (QSELx, x=0–6).

For this and similar schemes, a pair of internal data write signals (DIN7 and $\overline{\text{DIN7}}$) 12 and 14 are gated by an internal write signal ($\overline{\text{INTW}}$) 16 in a write control driver 18 to produce a pair of global data write signals. For the illustrated case, assume that a column of a memory core which would ordinarily receive data signals GDW7 and $\overline{\text{GDW7}}$ (from signals DIN7 and $\overline{\text{DIN7}}$ gated by $\overline{\text{INTW}}$) is replaced by a redundant column. Hence DIN7 and $\overline{\text{DIN7}}$ are provided to the write control driver 18 along with the internal write signal ($\overline{\text{INTW}}$) 16. The resulting global data write signals GDW7 20 and $\overline{\text{GDW7}}$ 22 are provided to the global data write bus 24 and to the redundant data write driver 10. Typically, DIN7 and $\overline{\text{DIN7}}$ are always the logic complement of each other; however, GDW7 and $\overline{\text{GDW7}}$ are logic high except during periods when the internal write pulse $\overline{\text{INTW}}$ is active, when they are true and complement of one another.

In order to transfer the logic states of the global data write signals GDW7 20 and $\overline{\text{GDW7}}$ 22 to the redundant data write lines RD and $\overline{\text{RD}}$ control logic 26 is used to enable the corresponding redundant data write driver 10. In particular, one of the eight select signals QSELx (x=0–7), in this case QSEL7, will be brought to a logic high to enable the corresponding redundant data write driver 10. The effect of this signal is to open transmission gates 28 and 30, allowing the pair of global data lines 20 and 22 to pass data to the redundant data write lines RD and $\overline{\text{RD}}$. Because redundancy has been selected, signal RCEN (Redundant Column Enable) is active (logic high), thus disabling the static pull-up transistors 32 and 34. Thus, these transistors are prevented from helping in the recovery of the redundant data write lines after a write operation.

The above not only describes the operation of this prior scheme, but also highlights two of its disadvantages: (a) it inconsistently loads the global data write bus 24, loading heavier the pair of global data lines 20 and 22 which also drive the redundant data write lines RD and $\overline{\text{RD}}$; and (b) it does not use the redundant data write line p-channel pull-up transistors 32 and 34 to help the recovery of the redundant data write lines, the recovery being left for the specific write control driver 18 associated with the pair of global data write lines 20 and 22, already heavier loaded than the rest of the global data write lines.

Figure 2:
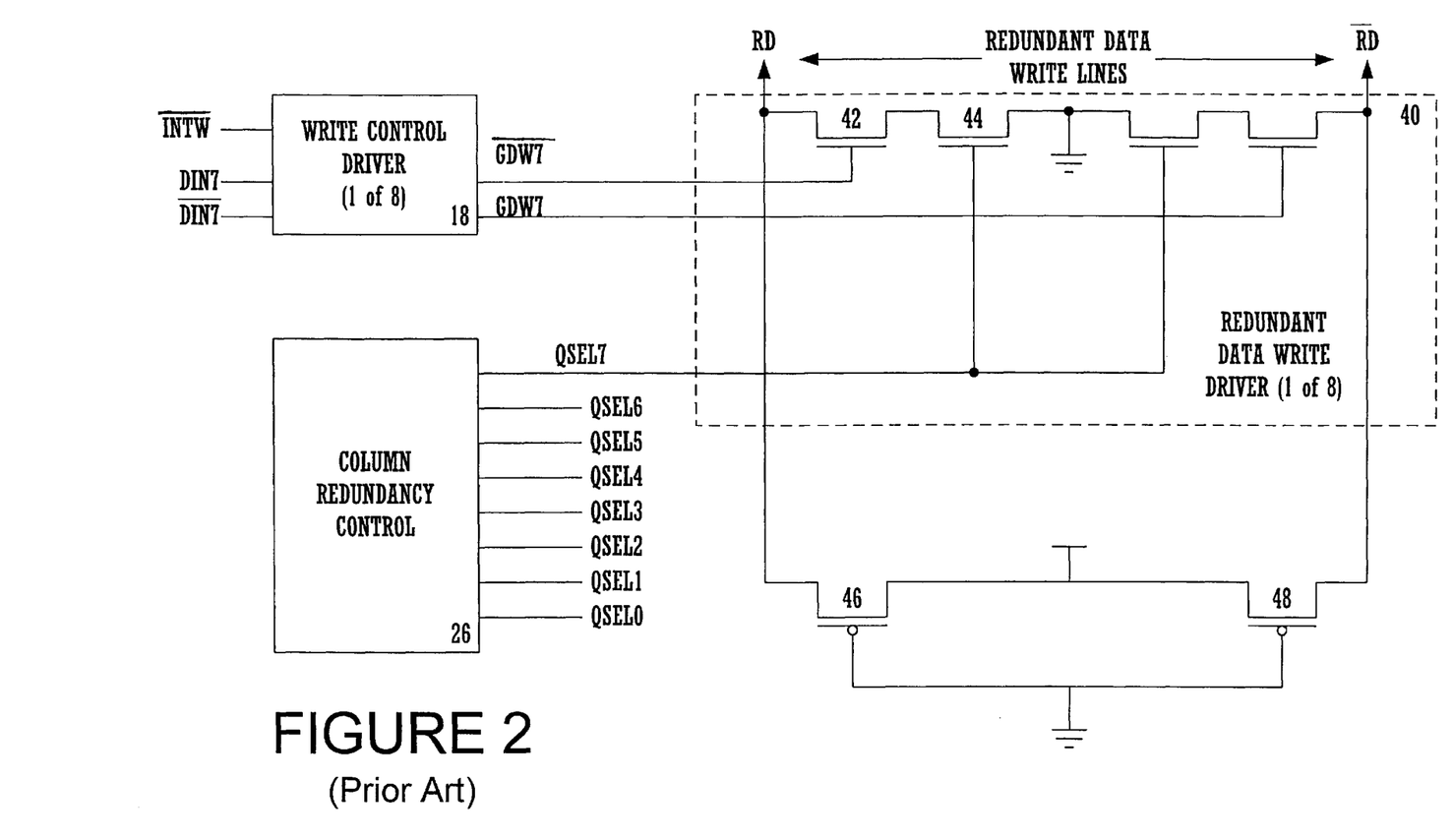
FIG. 2 illustrates another conventional scheme for driving redundant data write lines of a memory device using static pull-up devices.

Another common solution is to use static pull-up transistors, such as transistors 46 and 48 shown in FIG. 2, to hold the redundant data lines (RD and/or $\overline{\text{RD}}$) at a logic high potential in the absence of either a redundancy write operation or a logic low global data write signal. During a redundancy write operation, the redundant data write driver 40 pulls down one of the redundant data lines to a logic low potential when a logic low global data write signal is asserted. For this scheme (or variations thereof), eight parallel paths to ground (one for each data bit, x=0–7) are provided for each redundant data line, each with two n-channel transistors, e.g., 42 and 44, forming a wired-OR circuit. This wired-OR circuit is used to pull down the appropriate redundant data line (RD or $\overline{\text{RD}}$) during a write operation to the redundant column. In this case, however, the write operation (i.e., to pull down the potential of the redundant data line to a logic low) "fights" against the action of the static p-channel pull-up transistors 46 and 48. Thus, the sizing of these pull-up transistors 46 and 48, which need to be small enough to limit the crowbar (a condition characterized by a direct path between a voltage source and ground and, hence, one in which a significant amount of current is consumed) on the redundant data write lines during a write, but also strong enough to ensure a fast recovery of the redundant data write lines at the end of write, becomes important. Hence, although simple, the static pull-up transistor implementation of FIG. 2 has the disadvantage of largely crowbarring the redundant data write lines (thus increasing the time required to complete the write operation) for sufficient redundant data write line recovery at the end of write.

Accordingly, what is desired is a scheme to drive redundant data write lines of a memory device which preferably loads consistently the data input lines independent of whether redundancy is used or not and which avoids the large crowbar conditions (while still retaining the short recovery times) present in the redundant data write line driving schemes of the past.

SUMMARY OF THE INVENTION

In one embodiment, the present invention provides a reduced complexity dynamic pull-up suppressor for column redundancy write schemes with redundant data write lines. According to the present scheme, the logic values of the input data during the width of an internal write pulse are used to dynamically enable/disable p-channel pull-up transistors of a pair of complementary redundant data write lines, thus reducing redundant data line crowbar while increasing the speed of a write operation to a redundant column as compared to schemes of the past. In addition, the full recovery capability of the dynamic p-channel pull-up transistors coupled to the redundant data write lines is available to speed up the recovery of the redundant data write lines at the end of the write operation. The proposed solution also separates the data write bus from the redundant data write lines, thus ensuring a consistent loading of the data write bus, independent of whether redundancy is used or not. The scheme may be implemented in a redundant data write driver located a short distance from a spine (if it exists), driving short redundant write lines to the closest columns (of redundant cells) in a memory array.

According to a further embodiment of the present invention, a circuit including dynamically driven elements configured to drive a redundant data write line of a memory device to a logic state according to a state of an input data signal is provided.

The circuit may further include a static pull-up circuit configured to hold the redundant data line at a logic high potential when column redundancy is not used and solid data (i.e., when all bits are either logic 1or 0) is written. The dynamically driven elements may comprise a CMOS inverter coupled to receive the input data signal gated by an internal write pulse (i.e., an internal data write signal) and to drive the redundant data write line. In such an embodiment, the CMOS inverter may be further coupled to a switch element configured to be responsive to an activation signal which indicates whether or not the redundant data line is to follow the logic state of the input data signal. The switch element may be an n-channel transistor coupled between the CMOS inverter and ground and the static pull-up circuit may be a p-channel transistor coupled between the redundant data write line and a voltage source.

Other embodiments of the present invention include a memory device which includes the above circuit. Such a memory device may include an additional redundant data write line with corresponding dynamically driven elements coupled thereto. The additional dynamically driven elements may be configured to be responsive to another internal global data write signal.

In an alternative embodiment, a memory device includes a pair of redundant data write lines and a plurality of dynamic pull-up/down circuits coupled thereto. During an internal write pulse, the dynamic pull-up/down circuits may be configured to drive the redundant data write lines to complementary logic states according to the states of complementary input data signals. The memory device may also include a static pull-up circuit configured to hold the redundant data write lines at a logic high potential when column redundancy is not used and solid data is written.

In a further embodiment, a redundant data write line driver may include a number of dynamic pull-up/down circuits, all of which may be coupled to a single pair of redundant data write lines. Each dynamic pull-up/down circuit may include dynamically driven elements which may each comprise a complementary transistor pair. Each of the transistors of the dynamically driven elements may be separately driven by dynamic pull-up/down logic within the redundant data write line driver. The dynamic pull-up/down logic selectively activates (and/or deactivates) the respective transistors of the dynamically driven elements in response to global data write and control signals received from a write control driver and a column redundancy control block.

Yet another embodiment of the present invention allows for dynamically driving a redundant data write line of a memory device to a logic state of a first of a plurality of data signals, each of the plurality of data signals associated with a corresponding one of a plurality of dynamic pull-up/down circuits coupled to the redundant data write line. In such an embodiment, each of the plurality of data signals may activate its corresponding dynamic pull-up/down circuit during the step of driving the redundant data write line. This embodiment may also include dynamically driving the redundant data write line to a logic high potential in response to the absence of an internal write pulse.

BRIEF DESCRIPTION OF THE DRAWINGS

The present invention is illustrated by way of example and not limitation in the figures of the accompanying drawings in which.

DETAILED DESCRIPTION

Described herein is a dynamic pull-up suppressor for column redundancy write schemes with redundant data write lines. Logic values of the input data during the width of an internal write pulse are used to dynamically enable/disable p-channel pull-up transistors of a pair of complementary redundant data write lines, thus reducing redundant data line crowbar while increasing the speed of a write operation to a redundant column as compared to schemes of the past. Further, the full recovery capability of the dynamic p-channel pull-up transistors coupled to the redundant data write lines is available to speed up the recovery of the redundant data write lines at the end of the write operation. The present solution also separates the data write bus from the redundant data write lines, thus ensuring a consistent loading of the data write bus, independent of whether redundancy is used or not.

Figure 3:
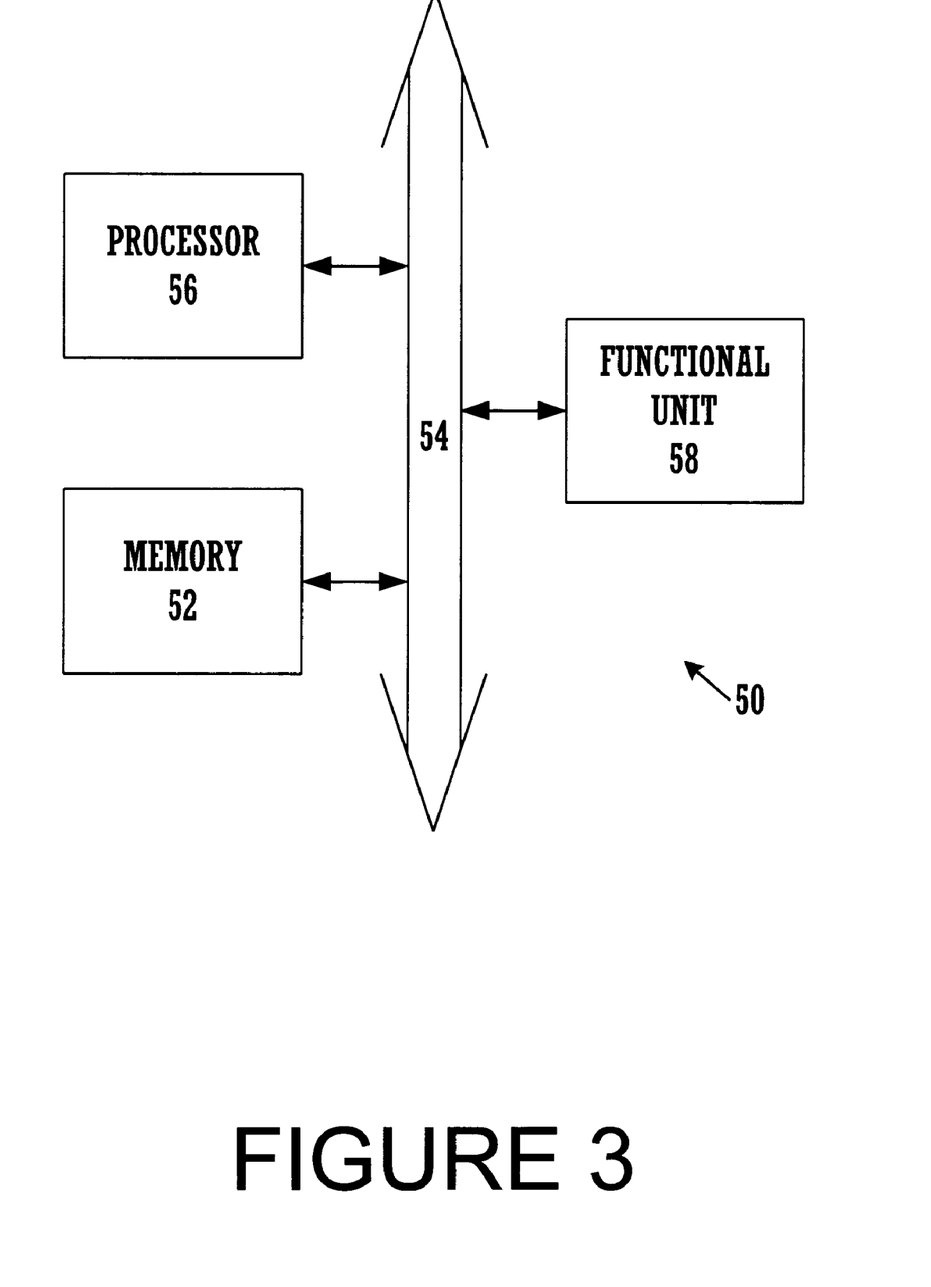
FIG. 3 illustrates a computer system including a memory device configured in accordance with one embodiment of the present invention.

FIG. 3 illustrates a computer system 50 which includes a memory 52 configured in accordance with an embodiment of the present invention. Memory 52 is coupled to a bus 54 which provides a communication path between memory 52 and a processor 56. In general, processor 56 uses memory 52 as a store of data and/or instructions. Computer system 50 may further include one or more functional units 58 which are coupled to bus 54. The functional units 58 may serve a variety of purposes, for example these units may be input/ output (I/O) devices which transfer information (e.g., data and/or control signals) to/from processor 56 and/or memory 52. Further, functional unit(s) 58 may be (a) bus bridge(s) which provides a communication path between bus 54 and another bus (not shown), e.g., a system bus, within computer system 50. In such a configuration, bus 54 may serve as a local or processor bus.

Although the remaining discussion will generally assume that it is memory 52 which is configured according to the present invention, it should be recognized that processor 56 may include an onboard cache memory (not shown). Such a cache memory operates as a local storage system for processor 56 and is generally configured to provide rapid read and/or write capability. The present invention finds equal applicability for use in such a cache memory or, further, for an external or L2 cache memory which may be coupled between processor 56 and bus 54. Accordingly, any references to the configuration and/or operation of memory 52 should be understood as being equally applicable to an onboard (or L1) cache within processor 56 and/or an external (or L2) cache. Note that in some processors, L1 and L2 caches may be contained on a single integrated circuit or the L2 cache may comprise a separate chip within a single package containing the L2 cache and a processor core. Further, the L1 cache may be implemented as separate instruction and data caches. All of these configurations are contemplated by the present invention, however, the present invention is not restricted to only L1 and L2 cache memories.

Figure 4:
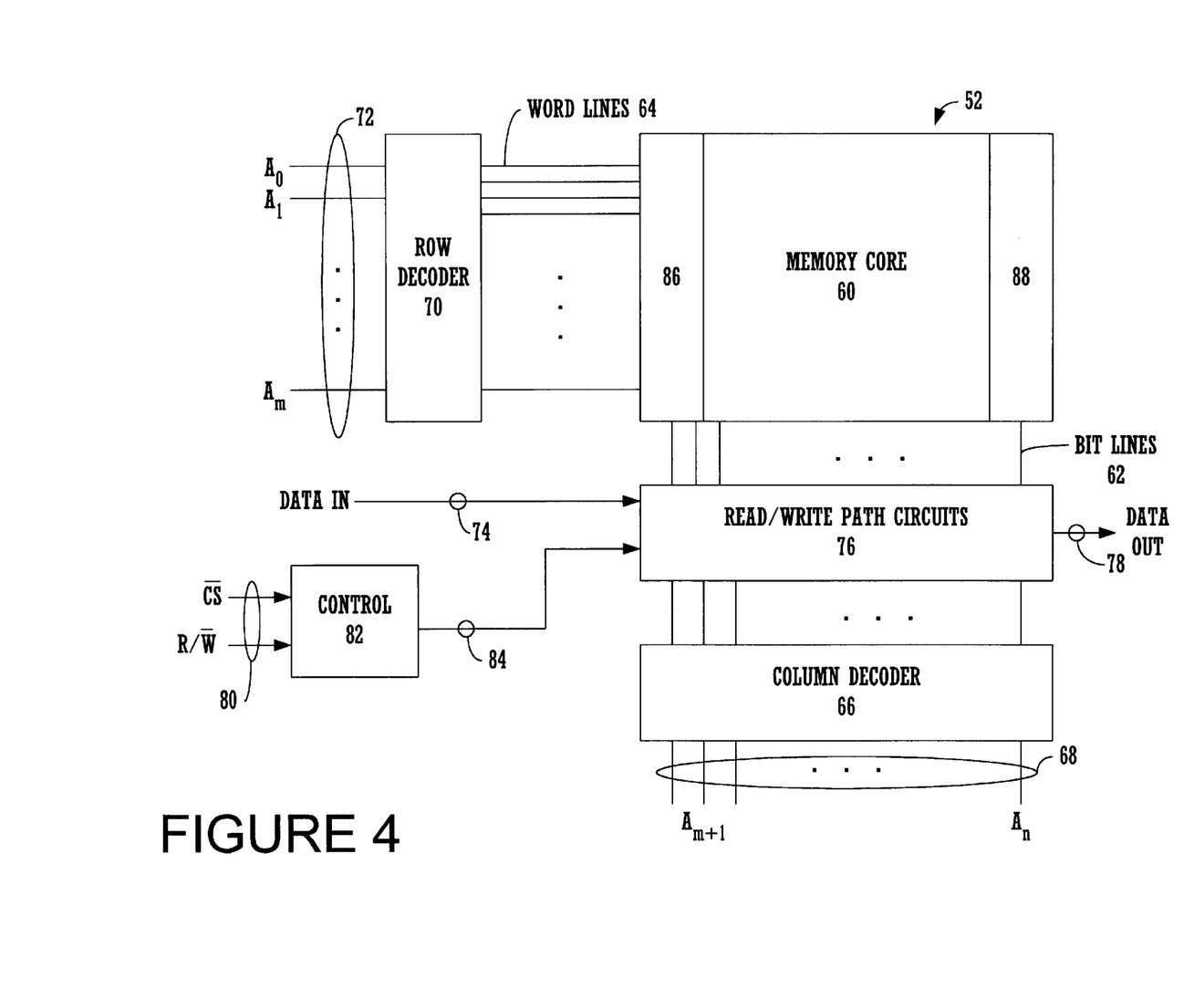
FIG. 4 illustrates a memory device configured in accordance with one embodiment of the present invention.

FIG. 4 illustrates memory 52 in more detail. Memory 52 generally includes a memory core 60 which is made up of a number of memory cells. The cells of memory core 60 are accessed during read or write operations using bitlines 62 and wordlines 64. The bitlines 62 are selected using a column decoder 66 which receives and decodes address information from a plurality of address lines 68. Similarly, word lines 64 are selected by row decoder 70 in response to address information on address lines 72. Address lines 68 and 72 may be part of bus 54.

During a memory write operation, data presented on Data In bus 74 may be applied to selected bitlines 62 through write path circuitry 76. (In general, portions of the write path circuitry may be shared by portions of the read path circuitry and, thus, the two are shown as a single block 76.) Individual cells of a column (associated with the selected bitlines) within memory core 60 are selected by appropriate wordlines 64 and the data from the Data In bus 74 is stored in one or more of the memory cells. During a memory read, data is read out of selected memory cells through read path circuitry 76 to a Data Out bus 78. Data In bus 74 and Data Out bus 78 may be the same bus (at least in part), coupled to bus 54. Read and write operations are controlled using one or more control signals 80 (from bus 54) which are decoded and/or buffered using control circuitry 82 to provide appropriate internal control signals 84 to the read/write path circuits 76. As discussed above, when one or more of the memory cells of a column of memory core 60 are found to be defective, the storage elements (cells) of a redundant column 86 or 88 may be used in place thereof. Appropriate control circuitry (which may be part of read/write path circuitry 76) is used to allow read and write operations which would otherwise be directed to the defective column of memory core 60 to be diverted to the replacement redundant column 86 or 88. The present invention is primarily directed to write operations involving the redundant column 86 or 88.

Figure 5:
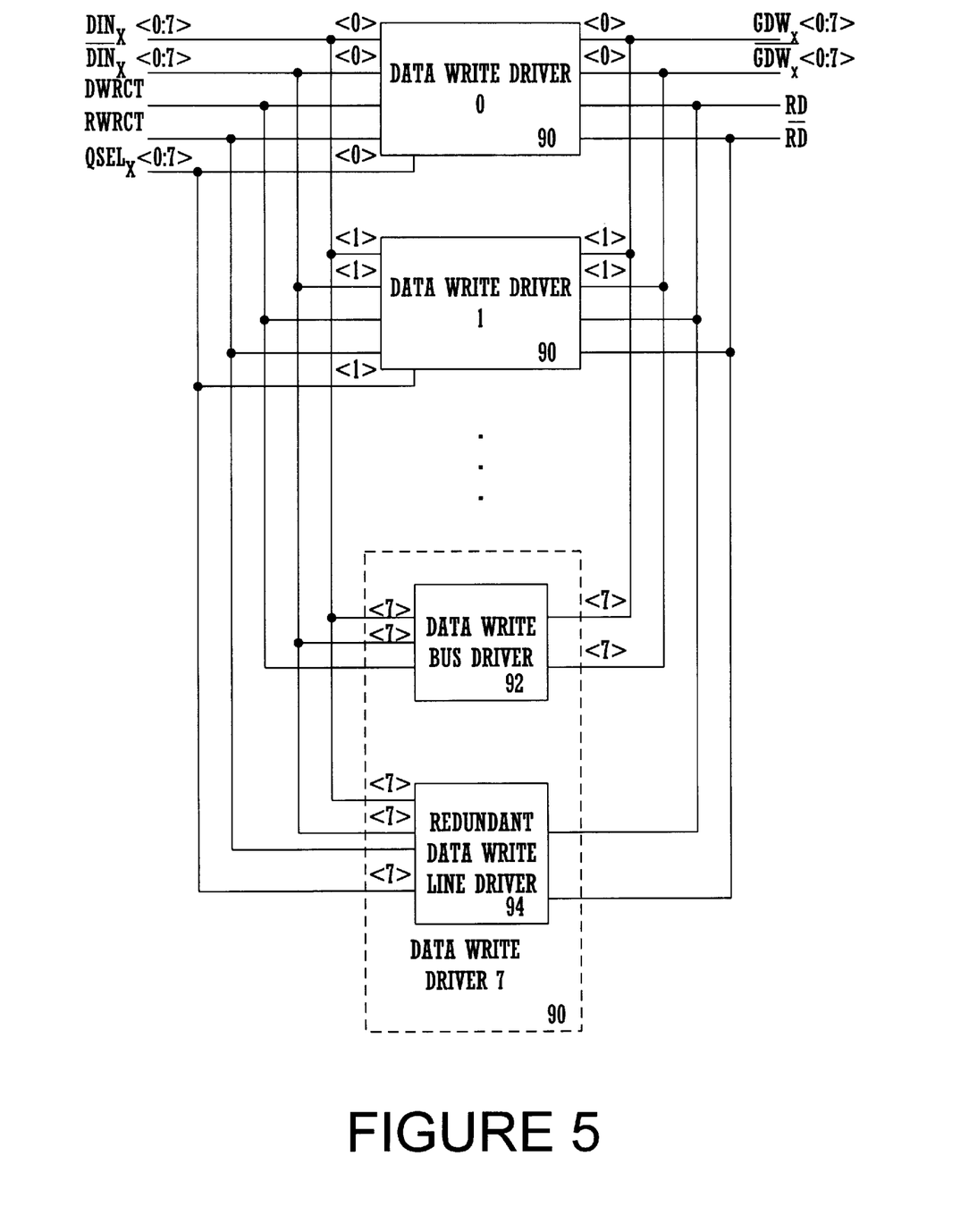
FIG. 5 illustrates a data write driver for a memory device configured in accordance with one embodiment of the present invention.

FIG. 5 illustrates a data write driver 90, composed of a data write bus driver 92 and a redundant data write line driver 94, which may be included in the write path control circuitry of memory device 52. Similar data write drivers 90 are used for each pair of data lines DINx and $\overline{DINx}$, x=0–7. Data write bus driver 92 has signal DWRCT (Data Write Control)—an internal write pulse—and data input signals DINx and $\overline{DINx}$ (e.g., x=0–7) as inputs, and provides global data write signals GDWx and $\overline{GDWx}$ (x=0–7) as outputs (e.g., to a spine). Redundant data write line driver 94 also receives data input signals DINx and $\overline{DINx}$ (x=0–7) as inputs. In addition, signal RWRCT (Redundant Write Control)—which, depending on the chip architecture, can be the same as DWRCT—and a "selected replaced column" signal, QSELx (x=0–7), are provided as inputs. The QSELx signals act as select or activation signals for the redundant data write line driver 94.

In operation, input data signals DINx and $\overline{DINx}$ are provided to data write driver 90, e.g., from input data paths within the memory device. In response to an internally generated write signal (DWRCT), the state of these data signals is passed to the global data write bus GDWx and $\overline{GDWx}$. These global data write signals are used to write the appropriate cells of the memory device with the data.

If redundancy is used (i.e., if a column of the memory core has been replaced with a redundant column), the corresponding QSEL signal will activate the redundant data write line driver 94 and the state of the data lines corresponding to the selected replaced column will be written to the redundant column through redundant data write lines RD and $\overline{RD}$. This aspect of the present invention addresses one of the disadvantages of the prior schemes. In particular, by separating the global data write bus from the redundant data write lines, and driving the two independently, the global data write bus receives consistent loading, whether redundancy is used or not.

Figure 6:
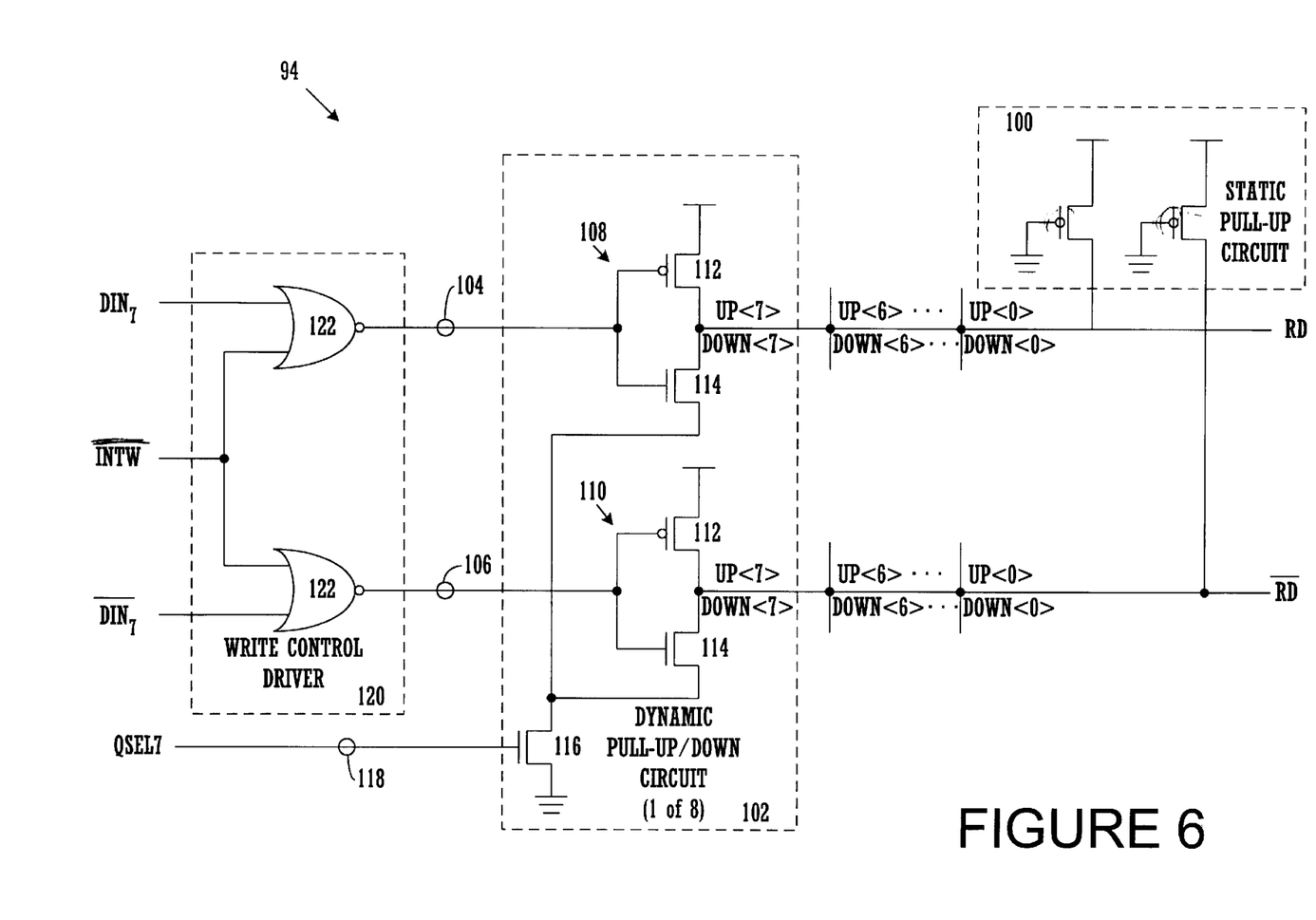
FIG. 6 illustrates a redundant data write driver for a memory device configured in accordance with one embodiment of the present invention.

The second goal of the present invention—to dynamically decrease the crowbar on the redundant data write lines during a write operation, while maintaining the maximum possible recovery strength on the redundant data write lines—is addressed with reference to FIG. 6, which illustrates one embodiment of the redundant data write line driver 94. As shown, the solution uses a weak, static pull-up circuit 100 combined with a plurality (e.g., eight) of dynamic pull-up/down circuits 102. The p-channel pull-up transistors 112 of dynamic pull-up/down circuits 102 are partially or totally disabled (suppressed) during an internal write pulse (depending on the logic values of the input data), but are all enabled at the end of the write operation, helping the recovery of the redundant data write lines. The gist of the idea is to combine the internal write pulse $\overline{INTW}$ (which is the general case of signals DWRCT and RWRCT in FIG. 5) with the input data signals DINx and $\overline{DINx}$, x=0–7, to provide signals which are used to drive the dynamic pull-up/down circuits 102 (in this sense, the term dynamic is used to reflect the fact that the driver circuits are directly responsive to the state of the input data and internal write signals). The price paid is some crowbar (reduced from the static pull-up implementations of the past) on the redundant data lines RD and $\overline{RD}$, by having some dynamic p-channel transistors 112 active during the write operation, depending on the logic values of the input data signals DINx and $\overline{DINx}$, x=0–7, during the active period of the internal write pulse. In addition, the full "pull-up strength" (of all of the of the dynamic pull-up/down circuits 102) is available to recover the redundant data lines RD and $\overline{RD}$ at the end of the write operation.

According to this embodiment of the present invention, the dynamic pull-up/down circuit 102 (which is one of a plurality, e.g., eight, such circuits coupled in parallel to the redundant data write lines RD and $\overline{RD}$) includes dynamically driven elements 108 and 110. Each dynamically driven element 108 and 110 is configured to drive a redundant data line, RD or $\overline{RD}$ respectively, of the memory device to a logic state according to the state of the corresponding input data signal, DINx or $\overline{DINx}$, x=0–7. The static pull-up circuit 100 is configured to hold the redundant data lines RD and $\overline{RD}$ at a logic high potential when column redundancy is not used and solid data is written. At times other than when the internal write pulse is active (i.e., signal $\overline{INTW}$ is a logic high), signals 104 and 106 are logic low and both dynamic p-channel pull-up transistors 112 in dynamically driven elements 108 and 110 act to pull up the logic level of their associated redundant data lines. However, if solid data is written and column redundancy is not used (QSELx=0, x=0–7), there is no path to ground and, depending on the logic value of the input data, all eight redundant data write drivers 94 will have either signal 104 or 106 at logic high during the internal write pulse ($\overline{INTW}$=0). Hence, the corresponding redundant data write line (RD or $\overline{RD}$) would float, and it is only the static pull-up circuit 100 which holds high the logic level of these lines.

As shown, for this embodiment the dynamic pull-up/down circuits 102 include dynamically driven elements 108 and 110 which are CMOS inverters. Each inverter is made up of a p-channel transistor 112 (the dynamic p-channel pull-up transistors described above) and an n-channel transistor 114. In general, the n-channel transistors 114 are much stronger than the p-channel transistors 112. For example, the n-channel transistors 114 may have gate width to length ratios of 20/0.5 (for 0.5 μm technology) while the p-channel transistors 112 may have gate width to length ratios of 1.1/1.1.

Each dynamically driven element 108 and 110 may be further coupled to a switch element 116 configured to be responsive to an activation signal 118 (e.g., QSEL7) provided by appropriate control logic to indicate whether or not the redundant data lines off the dynamic pull-up/down circuits 102 are to follow the logic states of the input data signals DIN7 and $\overline{DIN7}$. For the illustrated embodiment, the switch element 116 is an n-channel transistor and the static pull-up circuit 100 is implemented using p-channel transistors. However, other transistors could be used provided the overall logic functionality of the illustrated embodiment is maintained. For one embodiment, n-channel transistor 116 may be approximately the same size as transistors 114 and the p-channel transistors which make up static pull-up circuit 100 may be approximately the same size as transistors 112.

This embodiment of the present invention allows for dynamically driving the redundant data lines of the memory device to logic states of a selected one of a plurality of data signals. As shown, each of the data signals is associated with a corresponding dynamic pull-up/down circuit coupled to the redundant data lines RD and $\overline{RD}$. One of the data signals activates its corresponding dynamic pull-up/down circuit to drive the redundant data line. In the absence of the data signal, e.g., at the end of the write operation, the dynamically driven elements 108 and 110 will drive the redundant data lines high.

Write control driver 120 which is used to combine the internal write signal $\overline{INTW}$ with the data signals DIN7 and $\overline{DIN7}$ may be implemented using any appropriate logic. For example, the NOR gates 122 ensure that the state of the data signals is passed to the dynamic pull-up/down circuit 102 only during an internal write pulse (i.e., a time when the internal write signal is active). Such timing is important to ensure that the correct data state is written to the cells of the redundant column. So long as these timing considerations are maintained, other logic devices may be used to construct write control driver 120.

As indicated, each pair of data lines DINx and $\overline{DINx}$ (x=0–7) have an associated dynamic pull-up/down circuit 102. However, because of the action of the select signals QSELx (x=0–7), only one such circuit will be active to control the logic states of the redundant data lines RD and $\overline{RD}$ during a write operation. To illustrate, consider the case where the column of the memory core associated with DIN7 and $\overline{DIN7}$ is replaced with a redundant column. This means that QSEL7 will be active (logic high), while QSEL0–QSEL6 will not be active (logic low). With QSEL7 active, dynamically driven elements 108 and 110 of the dynamic pull-up/down circuit 102 associated with DIN7 and $\overline{DIN7}$ are provided with a path to ground. Thus, these dynamically driven elements are capable of pulling the logic level of redundant data write lines RD and $\overline{RD}$ low. The remaining dynamically driven elements of the dynamic pull-up/down circuits 102 associated with the remaining data lines do not have such a path to ground (i.e., the respective switch elements 116 of these dynamic pull-up/down circuits are off). Thus, these dynamic pull-up/down circuits are not capable of pulling the logic level of redundant data write lines RD and $\overline{RD}$ low.

Although only one set of dynamically driven elements (i.e., that set associated with the activated dynamic pull-up/down circuit) are capable of pulling the logic level of redundant data write lines RD and $\overline{RD}$ low, each set of dynamically driven elements of each dynamic pull-up/down circuit is still capable of pulling the logic states of these lines high. That is, each dynamically driven elements 108 and 110 of each dynamic pull-up/down circuit 102 for each pair of data lines DINx and a $\overline{DINx}$ (x=0–7), has a path from a voltage source (e.g., Vcc) to a redundant data write line RD or $\overline{RD}$ through a p-channel transistor 112. Thus, in response to a signal 104 or 106 to any of the dynamic pull-up/down circuits 102, where the signal 104 or 106 is a logic low, the corresponding dynamically driven element 108 or 110 for that dynamic pull-up/down circuit 102 will pull the associated redundant data write line RD or $\overline{RD}$ high. Thus, at the end of a write operation, i.e., when signal $\overline{INTW}$ goes to logic high, all of the dynamically driven elements 108 and 110 of each of the dynamic pull-up/down circuits 102 act to pull their corresponding redundant data write line RD or $\overline{RD}$ high. In this way, the maximum possible recovery strength on the redundant data write lines is provided.

Figure 7:
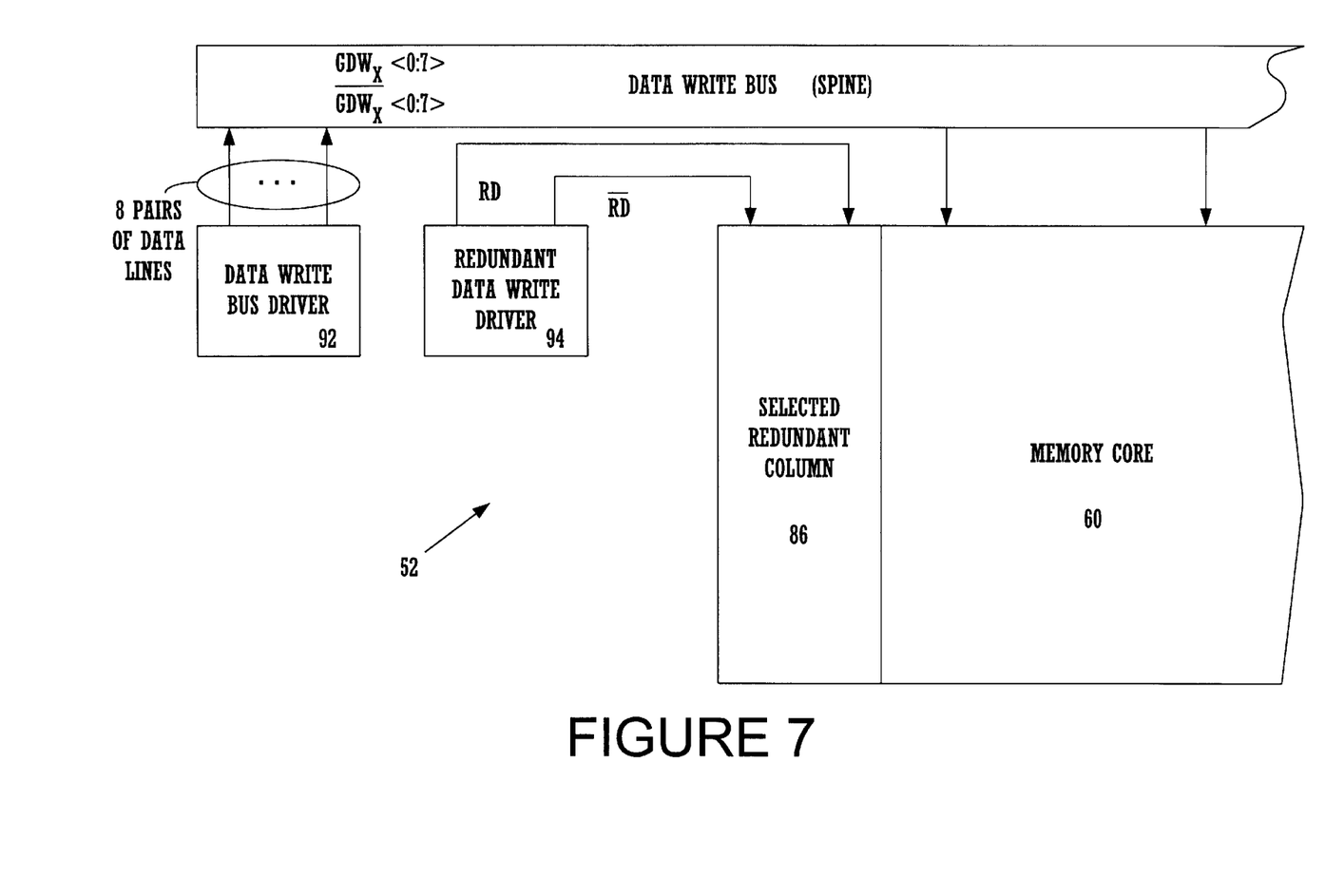
FIG. 7 illustrates the relative location of the redundant data write driver of FIG. 6 with respect to a redundant column within a memory device configured in accordance with one embodiment of the present invention.

Because of the relative sizing of the various transistors for this embodiment, redundant data write driver 94 should be positioned relatively close to the selected redundant column of memory cells as shown in FIG. 7. This is because the capacitance of the redundant data write lines RD and $\overline{RD}$ becomes important and, as the capacitance will increase as these lines become longer, if there is too much physical separation between the redundant column 86 and the redundant data write driver 94, there will not be sufficient time for the redundant data write lines to fully recover (e.g., to a logic high state) before a next operation is commenced. This can be counteracted by increasing the size of the p-channel pull-up transistors 112, but this is not desirable because of the increased crowbar it would generate. Similarly, if the capacitance of these lines is too large, the size of the n-channel transistors 114 and 116 should be increased, which would also lead to an increased crowbar current.

It is also recognized that this scheme will produce some crowbar on the redundant data lines, however, the relative sizing of the transistors now helps to reduce the overall crowbar from that seen in schemes of the past. The best case (for reduced crowbar) is when solid data (i.e., all bits either at a logic 0 or a logic 1) is written. In such a case, the dynamic pull-up is totally suppressed on the redundant data line which needs to be brought to logic 0. For example, consider the situation where the dynamic pull-up/down circuit 102 associated with data lines DIN7 and $\overline{\text{DIN7}}$ is activated (i.e., QSEL7 is active). If a data word "00000000" is to be written to the memory device, then all DINx=0 and all $\overline{\text{DINx}}$=1 (x=0–7). In this case, during the write operation (i.e., $\overline{\text{INTW}}$=0), dynamically driven element 108 of the dynamic pull-up/down circuit 102 associated with DIN7 pulls down the redundant data write line RD to a logic low. At the same time, each of the other dynamically driven elements 108 of the dynamic pull-up/down circuits 102 associated with the other data lines DIN0–DIN6, decouple the redundant data write line RD from the voltage source (recall that because QSEL0–QSEL6 are not active, the associated redundant data elements 108 have no path to ground and so cannot pull RD low; however, they will decouple RD from the voltage source because the associated p-channel transistors 112 are turned off). Thus, the dynamically driven element 108 associated with DIN7 only pulls down against the weak p-channel transistor of static pull-up circuit 100, minimizing the crowbar experienced.

Similarly, for the above example dynamically driven element 110 of the dynamic pull-up/down circuit 102 associated with $\overline{\text{DIN7}}$ (as well as all of the other dynamically driven elements 110 associated with all of the other data lines) pulls up the redundant data write line $\overline{\text{RD}}$ to a logic high. In this case, there is no crowbar on $\overline{\text{RD}}$.

In contrast, the worst case (for maximum crowbar) is when the data to be written to all of the non-redundant cells is the logical inverse of the data to be written to the redundant cell. In such a case, all of the dynamic p-channel pull-up transistors 112 of the non-redundant data lines as well as the static pull-up transistors are fighting against the write. For example, consider the situation where the dynamic pull-up/down circuit 102 associated with data lines DIN7 and $\overline{\text{DIN7}}$ is activated (i.e., QSEL7 is active). If a data word "01111111" is to be written to the memory device, then all DINx=1 and all $\overline{\text{DINx}}$=0 (x=0–6) while DIN7=0 and $\overline{\text{DIN7}}$=1. In this case, during the write operation (i.e., $\overline{\text{INTW}}$=0), dynamically driven element 108 of the dynamic pull-up/down circuit 102 associated with DIN7 pulls down the redundant data write line RD to a logic low. At the same time, each of the other dynamically driven elements 108 of the dynamic pull-up/down circuits 102 associated with the other data lines DIN0–DIN6, couple the redundant data write line RD to the voltage source (e.g., Vcc) (recall that even though QSEL0–QSEL6 are not active, the associated redundant data elements 108 have a path to the voltage source and so can pull RD high when the associated data input signal is a logic 1). Thus, the dynamically driven element 108 associated with DIN7 pulls against all of the weak p-channel transistors of the remaining dynamically driven elements 108 associated with DIN0–DIN6 and also pulls against the weak p-channel transistor of static pull-up circuit 100, maximizing the crowbar experienced.

At the same time, dynamically driven element 110 of the dynamic pull-up/down circuit 102 associated with $\overline{\text{DIN7}}$ pulls up the redundant data write line $\overline{\text{RD}}$ to a logic high. Each of the other dynamic elements 110 of the dynamic pull-up/down circuits 102 associated with the other data lines $\overline{\text{DINx}}$, x=0–6, decouple the redundant data write line $\overline{\text{RD}}$ from the voltage source (recall that because QSEL0–QSEL6 are not active, the associated redundant data elements 110 have no path to ground and so cannot pull $\overline{\text{RD}}$ low; however, they will decouple $\overline{\text{RD}}$ from the voltage source because the associated p-channel transistors 112 are turned off). Thus, the dynamically driven element 110 associated with DIN7 is not pulling against any of the n-channel transistors of the remaining dynamically driven elements 110 associated with the remaining data lines and so no crowbar experienced on $\overline{\text{RD}}$.

As indicated, crowbar (which varies depending on the logic value of the input data) exists only during the internal write pulse $\overline{\text{INTW}}$, and the amplitude of the crowbar current can be reduced by adequate weakening (i.e., sizing) of the p-channel pull-up transistors 112 (as well as the p-channel transistors of static pull-up circuit 100) in trade-off with the pull-up strength needed for write recovery. For nonsolid data, a portion of the dynamic pull-up transistors will fight against the write. That is, for situations where data words which have some bits at logic 0 and others at logic 1, some of the dynamic pull-up elements of the dynamic pull-up/down circuits 102 will be trying to pull up the redundant data write line while others will decouple the redundant data write line from the voltage source (of course only the selected dynamic pull-up/down circuit 102 associated with the data lines to write to the redundant column will provide an enabled pull-down path). The statistical average, over all the possible input data logic level combinations, has half of the bits at logic 0 and half at logic 1. This case of interleaved input data provides a reasonable estimate of the average crowbar current experienced on the redundant data lines during a write.

Figure 8:
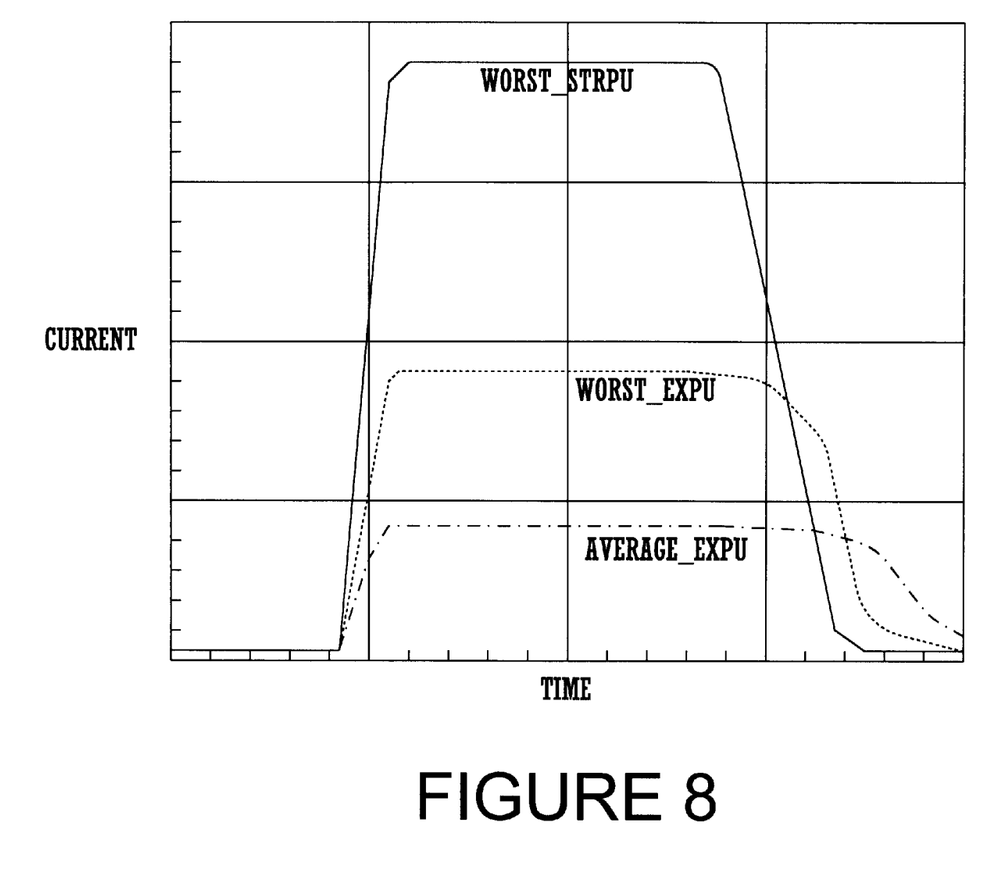
FIG. 8 is a graph illustrating crowbar currents for various simulations involving the redundant data write driver of FIG. 6.
Figure 9:
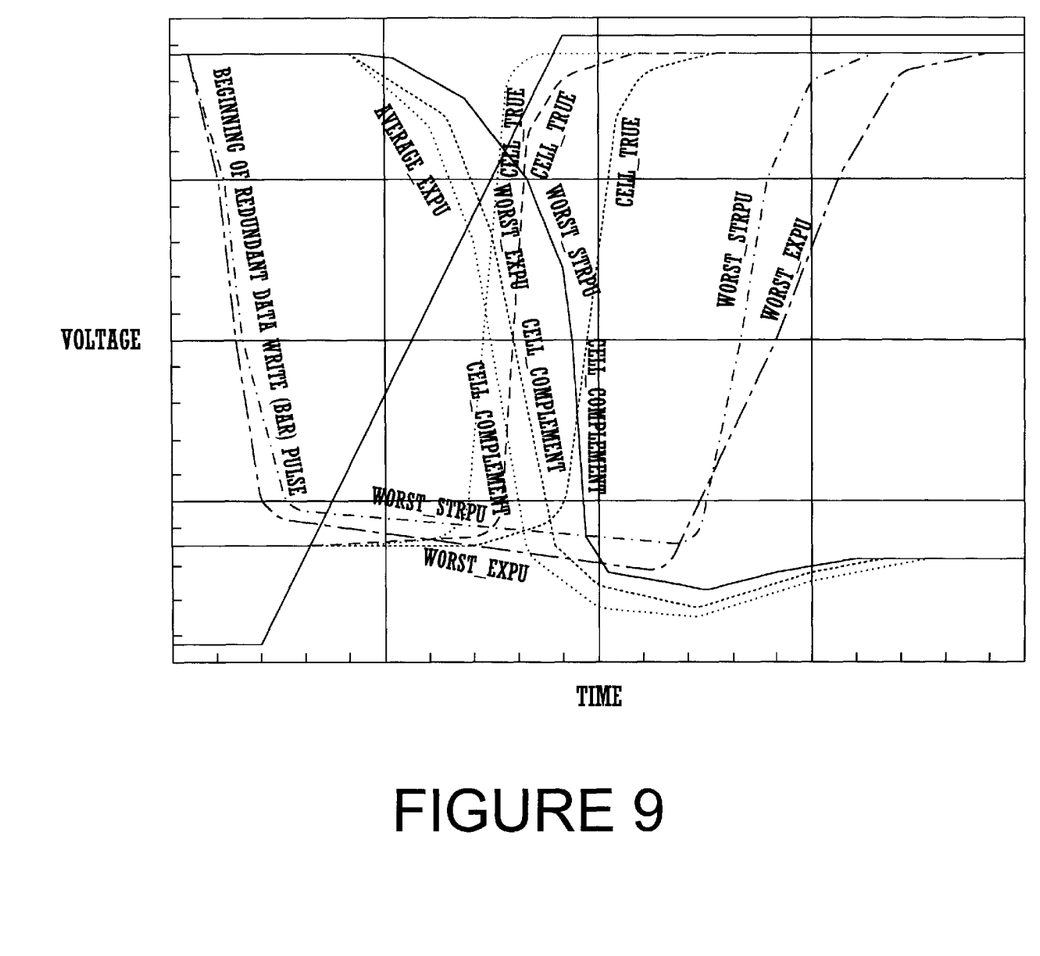
FIG. 9 is a graph illustrating various internal write signal waveforms for several simulations involving the redundant data write driver of FIG. 6.

FIG. 8 (for the crowbar current) and FIG. 9 (for the time instance the cell is written, the logic 0 level on the redundant data write line, and the slope of the end of write, which are monitored during a write cycle) show simulation results for the embodiment of FIG. 6 at 100° C., 2.9V, under 3 different cases (write enable pulse width approximately 7.3 ns): (a) p-channel transistors 112 having a gate width to length ratio of 1.1/1.1 and n-channel transistors 114 having a gate width to length ratio of 20/0.5 with the worst data combination (WORST_EXPU); (b) stronger p-channel transistors 112 (minimum length=0.5 μm) and worst data conditions (WORST_STRPU); and (c) transistors having the size characteristics of (a) with interleaved data combinations (AVERAGE_EXPU). The simulation results (all of which are approximate values) are also included in Table 1 below, for convenience:

TABLE 1

| | | Time cell | | Redundant Line Write Pulse | | |
|---|---|---|---|---|---|---|
| | Crowbar current ($\mu$A) | written after $\overline{\text{WE}}$ active (ns) | Write speed up vs. WORST_STRPU (ps) | 0 logic level (mV) | End of write slope (V/ns) | Width (ns) |
| WORST_STRPU | 848 | 8.76 | 0 | 400 | 2.573 | 4.52 |
| WORST_EXPU | 372 | 8.1 | 660 | 250 | 1.325 | 4.9 |
| AVERAGE_EXPU | 186 | 7.91 | 850 | 200 | 1.325 | 4.93 |

As indicated, the best end of write slope is approximately 2.57 V/ns (for the WORST_STRPU conditions), however the crowbar current and the logic 0 level on the redundant data write line are somewhat higher that desirable for some applications (approximately 848 $\mu$A and 400 mV, respectively). Moreover, for these conditions the redundant cell is written approximately 8.76 ns after $\overline{\text{WE}}$ is active. This is the slowest write of all the observed simulation results.

In the WORST_EXPU case, improved values (over those for the WORST_STRPU case) for the crowbar current (approximately 372 $\mu$A) and the logic 0 level on the redundant data lines (approximately 250 mV) were observed. In addition, the redundant cell is written approximately 660 ps faster than was the case for the stronger pull-up transistors. As expected, the end of write slope (approximately 1.33 V/ns) is not as steep as in the WORST_STRPU case, but still allows improved (e.g., over static pull-up schemes of the past) write parameter margins. Moreover, as was pointed out above, the AVERAGE_EXPU conditions should yield the statistically average values for these parameters. In such a case, a crowbar current of only approximately 186 $\mu$A was obtained, combined with logic 0 level on the redundant data write line of approximately 200 mV. The reduced crowbar current sped up the write operation by 850 ps over that seen for the WORST_STRPU case, the end of write slope being obviously the same as in the WORST_EXPU case (because all the p-channel pull-up transistors 112 contribute to the redundant data line recovery). These results tend to indicate that the deliberate use of a circuit which allows crowbar to occur (what would otherwise be a counter-intuitive proposition) actually performs very well given its reduced complexity. By properly sizing the pull-up and pull-down transistors of the dynamic pull-up/down circuit 102 to achieve desired write parameters, the crowbar (which occurs only when the internal write pulse $\overline{\text{INTW}}$ is active) can be held to acceptable levels.

Unfortunately, the embodiment of FIG. 6 is not appropriate for all situations. For example, as discussed with reference to FIG. 7, the redundant data write driver 94 should be placed close to the redundant columns of storage elements (cells) in order to minimize the effect of the redundant data line capacitance. If these lines become too long, the time required to charge and discharge these lines during and after a write operation may be such that one can no longer guarantee that the redundant cell will be written properly unless the crowbar current reaches often unacceptably high values. In such cases, an alternative embodiment of the present invention should be used. Such an alternative is illustrated in FIG. 10.

Figure 10:
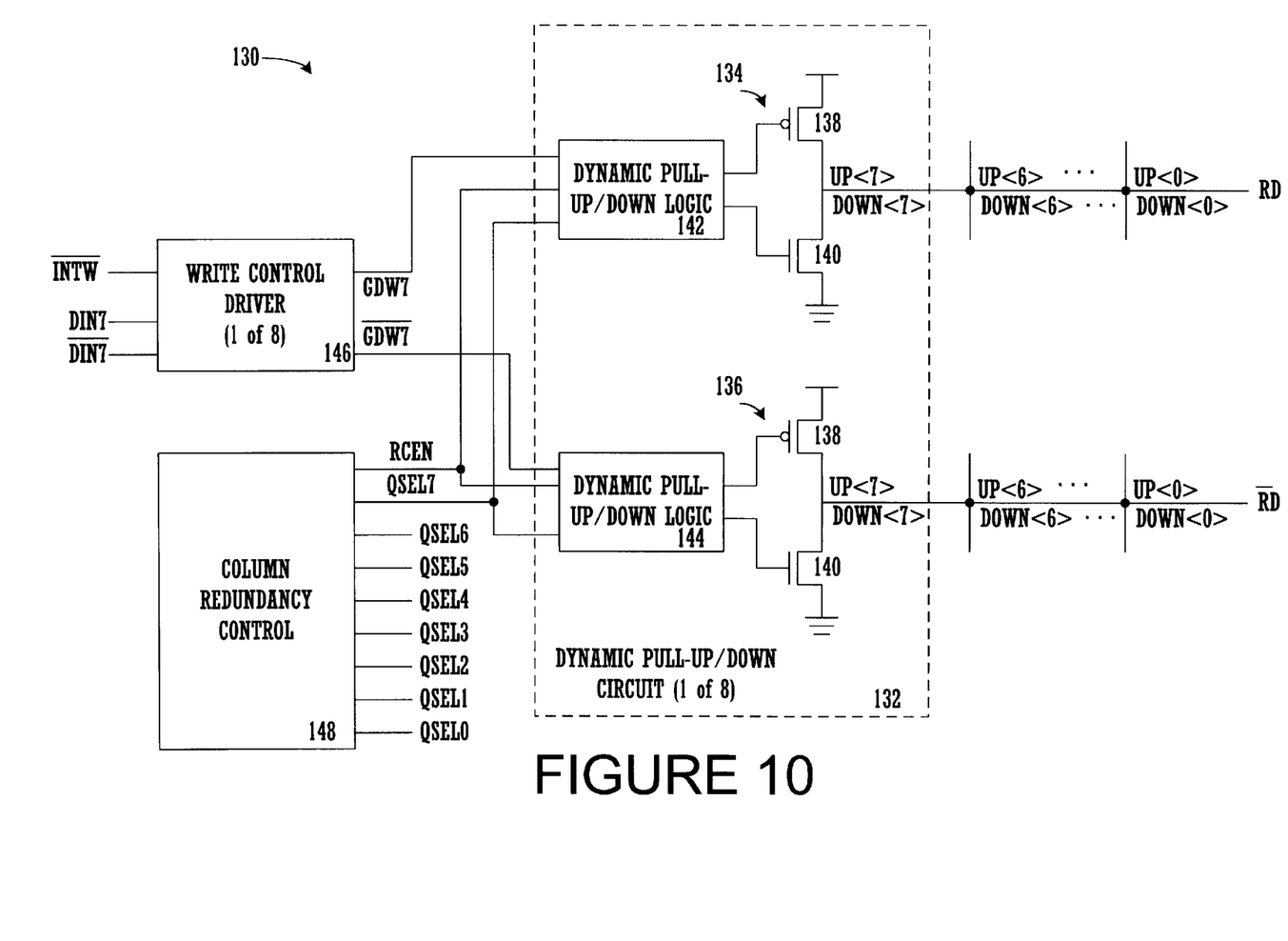
FIG. 10 illustrates an alternative redundant data write driver for a memory device configured in accordance with a further embodiment of the present invention.

The redundant data write line driver 130 shown in FIG. 10 includes eight identical dynamic pull-up/down circuits 132 (of which only one is illustrated in detail). Each of the dynamic pull-up/down circuits 132 are coupled to the redundant data lines RD and $\overline{\text{RD}}$, however, no static pull-up circuits are required for this embodiment. Each dynamic pull-up/down circuit 132 includes dynamically driven elements 134 and 136 which for the illustrated configuration include a complementary transistor pair. The transistor pairs are each made up of a p-channel transistor 138, coupled between a voltage source (e.g., Vcc) and one of the redundant data write lines, and an n-channel transistor 140, coupled between the redundant data write line and ground. As shown, each of the transistors of the dynamically driven elements 134 and 136 is separately driven by dynamic pull-up/down logic 142 and 144, respectively. The dynamic pull-up/down logic 142 and 144 selectively activates (and/or deactivates) the respective transistors 138 and 140 of dynamically driven elements 134 and 136 in response to data and control signals received from a write control driver 146 and a column redundancy control block 148.

In operation, a pair of internal data write signals (DINx and $\overline{\text{DINx}}$, x=0–7) are gated by an internal write signal ($\overline{\text{INTW}}$) in write control driver 146 to produce a pair of corresponding global data write signals GDWx and $\overline{\text{GDWx}}$, x=0–7. For the illustrated case, assume that a column of a memory core which would ordinarily receive data signals DIN7 and $\overline{\text{DIN7}}$ is replaced by a redundant column. Hence DIN7 and $\overline{\text{DIN7}}$ are provided to the write control driver 146 along with the internal write signal $\overline{\text{INTW}}$. The resulting global data write signals GDW7 and $\overline{\text{GDW7}}$ are provided to the dynamic pull-up/down circuit 132.

In order to transfer the logic states of the global data write signals GDW7 and $\overline{\text{GDW7}}$ to the redundant data write lines RD and $\overline{\text{RD}}$, control logic 148 is used to enable the corresponding dynamic pull-up/down logic 142 and 144 of dynamic pull-up/down circuit 132. In particular, one of eight select signals QSELx (x=0–7), in this case QSEL7, will be brought active (because redundancy has been selected, signal RCEN is also active) to enable the corresponding dynamic pull-up/down logic 142 and 144. The effect of this signal is to allow the state of the global data lines GDW7 and $\overline{\text{GDW7}}$ to activate the dynamically driven elements 134 and 136, thereby passing data to the redundant data write lines RD and $\overline{\text{RD}}$. No crowbar on the redundant data write lines exits during these operations, because the remaining dynamic pull-up/down circuits 132 corresponding to the other data lines decouple the pulled-down redundant data write line from the voltage source. That is, because the respective QSEL signals for these remaining dynamic pull-up/down circuits 132 remain inactive although column redundancy is used (RCEN active), the corresponding p-channel pull-up transistors 138 as well as the n-channel pull-down transistors 140 are turned off, decoupling the redundant data write line from the voltage source as well as from ground. Moreover, for the selected dynamic pull-up/down circuit 132, the dynamic pull-up/down logic 142 and/or 144 operates to keep transistors 140 turned off when p-channel transistors 138 are on, thus preventing crowbar within a single dynamic pull-up/down circuit 132. The exact configuration of dynamic pull-up/down logic blocks 142 and 144 is a design choice and several different configurations can be implemented to achieve these desired functions. Of course, for periods outside of a write operation as well as when column redundancy is not used (RCEN inactive), these dynamic pull-up/down logic blocks should also force p-channel transistors 138 on and n-channel transistors 140 off, so as to allow the dynamic pull-up/down circuit 132 to pull the redundant data write lines RD and $\overline{RD}$ high.

In order to achieve this functionality, all the dynamic pull-up transistors 138 in the individual dynamically driven elements 134 and 136 may be configured together in a single, stronger, dynamic pull-up transistor for each redundant data write line.

In conclusion, when column redundancy is used, only one pull-down n-channel transistor 140 pulls down the corresponding redundant data write line while all the other pull-up and pull-down transistors corresponding to that line are turned off. Also, by combining RCEN in the dynamic pull-up/down logic, it is ensured that the redundant data write lines do not float when column redundancy is not used, all the pull-ups being active, while all the pull-downs are turned off so the line is held logic high.

Thus, a dynamic pull-up suppressor for column redundancy write schemes with redundant data write lines has been described. Although the foregoing description was set forth with reference to certain illustrated embodiments, it should be appreciated that the present invention is in no way limited to these examples and that the invention should only be measured in terms of the claims which follow.

What is claimed is:

1. A circuit, comprising:
   a dynamically driven element coupled to drive a redundant data write line of a memory device to a logic state according to a state of an input data signal; and
   a static pull-up circuit configured to hold the redundant data write line at a logic high potential when a column redundancy is not used and solid data is written to the memory device, said static pull-up circuit configured to contribute to recovery of said redundant data write line.

2. A circuit as in claim 1 wherein the dynamically driven element comprises a CMOS inverter coupled to (i) receive the input data signal and (ii) drive the redundant data write line.

3. A circuit as in claim 2 wherein the CMOS inverter is further coupled to a switch element configured to be responsive to an activation signal which indicates whether or not the redundant data write line is to follow the logic state of the input data signal.

4. A circuit as in claim 3 wherein the switch element comprises an n-channel transistor coupled between the CMOS inverter and ground.

5. A circuit as in claim 4 wherein the static pull-up circuit comprises a p-channel transistor coupled between the redundant data write line and a voltage source.

6. A circuit as in claim 1 wherein the dynamically driven element is further configured to pull the redundant data write line to a logic high potential in the absence of the input data signal.

7. A memory device comprising the circuit of claim 1; at least one redundant memory cell coupled thereto; a global data write bus; and an array of main memory cells coupled to the global data write bus.

8. A memory device as in claim 7 further comprising a second redundant data write live and a corresponding second dynamically driven element coupled thereto and configured to be responsive to a complementary input data signal.

9. A memory device as in claim 8 wherein the dynamically driven element and the second dynamically driven element each comprises CMOS inverters.

10. A memory device as in claim 9 wherein each of the CMOS inverters are isolated from ground by a switch element configured to be responsive to an activation signal which indicates whether or not the redundant data write line is to follow the logic state of the input data signal.

11. A memory device as in claim 10 further comprising a static pull-up circuit configured to hold the redundant data write line and the second redundant data write line at a logic high potential when column redundancy is not used and solid data is written to the memory device.

12. A circuit as in claim 1 wherein the dynamically driven element comprises a complementary transistor pair coupled between a voltage source and ground.

13. A memory device, comprising:
   a pair of redundant data write lines;
   a plurality of dynamic pull-up/down circuits coupled to the pair of redundant data write lines and configured to drive the pair of redundant data write lines to complementary logic states according to the states of complementary input data signals; and
   a static pull-up circuit configured to hold the pair of redundant data write lines at a logic high potential when a column redundancy is not used and solid data is written to the memory device, said static pull-up circuit configured to contribute to recovery of at least one of said pair of redundant data write lines.

14. A memory device, comprising;
   a pair of redundant data write lines; and
   a plurality of dynamic pull-up/down circuits coupled to the pair of redundant data write lines and configured to drive the pair of redundant data write lines to complementary logic states according to the states of complementary input data signals; and
   a static pull-up circuit configured to hold the pair of redundant data write lines at a logic high potential when column redundancy is not used and solid data is written to the memory device, said static pull-up circuit configured to contribute to recovery of at least one of said pair of redundant data write lines.

15. A memory device as in claim 14 wherein the dynamic pull-up/down circuits comprise CMOS inverters.

16. A method comprising dynamically driving a redundant data write line of a memory device to a logic state of a first of a plurality of data signals, each of the plurality of data signals associated with a corresponding one of a plurality of dynamic pull-up/down circuits coupled to the redundant data write line;
   dynamically driving the redundant data write line to a logic high potential in response to the absence of an internal write pulse; and
   utilizing a static pull-up circuit to hold the redundant data write line at a logic high potential when a column redundancy is not used and solid data is written to the memory device, said static pull-up circuit configured to contribute to recovery of said redundant data write line.

17. A method as in claim 16 wherein each of the plurality of data signals activates its corresponding dynamic pull-up/down circuit during the step of driving the redundant data write line.

* * * * *